United States Patent [19]
Wik

[11] Patent Number: 6,137,716
[45] Date of Patent: Oct. 24, 2000

[54] MEMORY SYSTEM USING MULTIPLE STORAGE MECHANISMS TO ENABLE STORAGE AND RETRIEVAL OF MORE THAN TWO STATES IN A MEMORY CELL

[75] Inventor: Thomas R. Wik, Livermore, Calif.

[73] Assignee: LSI Logic Corporation, Milpitas, Calif.

[21] Appl. No.: 08/920,111

[22] Filed: Aug. 26, 1997

Related U.S. Application Data

[63] Continuation-in-part of application No. 08/865,470, May 29, 1997, Pat. No. 5,841,695.
[51] Int. Cl.[7] .................................................. G11C 16/04
[52] U.S. Cl. ............................... 365/185.01; 365/185.08; 365/149; 365/104
[58] Field of Search ........................... 365/185.05, 177, 365/45, 185.26, 185.01, 98, 104, 149, 196

[56] References Cited

U.S. PATENT DOCUMENTS

| | | | |
|---|---|---|---|
| 4,276,616 | 6/1981 | Henning | 365/177 |
| 5,623,442 | 4/1997 | Gotou et al. | 365/185.08 |

*Primary Examiner*—David Nelms
*Assistant Examiner*—Thong Le
*Attorney, Agent, or Firm*—Conley, Rose & Tayon, P.C.; B. Noel Kivlin

[57] ABSTRACT

A memory circuit which uses multiple storage mechanisms in each of its memory cells. In one embodiment, the memory circuit includes an array of cells in which each cell has multiple storage elements. At least one of the storage elements performs its function in a different way than the rest of the storage elements. This use of multiple storage mechanisms allows for a greater freedom in memory cell design and allows for the simultaneous storage of multiple states in a single memory cell. Broadly speaking, the present invention contemplates a memory core comprising an address decoder, an array of cells, and a sense amplifier. The address decoder is configured to receive an address and responsively assert a selected word line. The array of cells includes a selected cell coupled to the selected word line, and each cell in the array of cells includes at least two storage elements. A first storage element is configured with a first state which is one of a first plurality of states, and a second storage element is configured with a second state which is one of a second, different plurality of states. The sense amplifier is coupled to the selected cell via a bit line and configured to detect the first and second states. Each cell may further include a third storage element configured with a third state which is one of a third plurality of states. In this case, the sense amplifier is also configured to detect the third state. Examples of candidate storage states include charges on a capacitance, conductivities of transistors, resistances between terminals, turn-on voltages of transistors, currents flowing in closed loops, and orientations of magnetized material.

10 Claims, 3 Drawing Sheets

MEMORY SYSTEM USING MULTIPLE STORAGE MECHANISMS TO ENABLE STORAGE AND RETRIEVAL OF MORE THAN TWO STATES IN A MEMORY CELL

This application is a continuation-in-part of Application No. 08/865,470, now U.S. Pat. No. 5,841,695, filed May 29, 1997.

BACKGROUND OF THE INVENTION

1. Field of the Invention

This invention relates to the field of solid state devices for information storage, and in particular to a method and structure for storing multilevel logic values in a dynamic random access memory (DRAM).

2. Description of the Related Art

Memory devices store and retrieve large quantities of digital data at electronic speeds. Early digital computers used magnetic cores as the devices in fast-access memories. With the introduction of semiconductor memory chips in the late 1960s, magnetic cores began to be replaced by integrated circuits which implement a much higher-density memory function. This not only increased the performance capabilities of the memory, but also drastically decreased its cost. By the end of the 1970s, magnetic core memories had been completely displaced as high-speed memory devices.

Memory capacities in digital systems are commonly expressed in terms of bits (binary digits), since a separate device or circuit is used to store each bit of data. Each storage unit is referred to as a cell. Memory capacities are also sometimes stated in terms of bytes (8 or 9 bits) or words (arbitrarily defined, but commonly 16–80 bits). Every bit, byte, or word is stored in a particular location, identified by a unique numeric address. Only a single bit, byte, or word is stored or retrieved during each cycle of memory operation.

The units of memory storage capacity are typically kilobits and megabits (or kilobytes and megabytes). Since memory addressing is based on binary codes, capacities that are integral powers of 2 are typically used. As a result, a memory device with a 1-kbit capacity can actually store 1024 bits, and a 64-kbyte device can store 65,536 bytes.

In digital computers, the number of memory bits is usually 100 to 1000 times greater than the number of logic gates, which implies that the memory cost per bit must be kept very low. In addition, it is desirable for the memory devices to be as small as possible (since this will allow the highest density of cells on a chip), to operate at a high speed, to have a small power consumption, and to operate reliably. To achieve this end, memory cells are designed to be as simple and compact as possible. Typically, the cell itself is not capable of outputting digital data in an electrical form compatible with the requirements of the remainder of the system. To restore the electrical characteristics of the cell's outputted data to adequate values, properly designed peripheral circuits (e.g. sense amplifiers, memory registers, and output drivers) are necessary. These circuits are designed to be shared by many memory cells. The trade-off thus made is that of a less robust output signal from the cell, in exchange for a simple, compact memory cell design.

The most flexible digital memories are those that allow for data storage (hereafter, writing) as well as data retrieval (hereafter, reading). Memories in which both of these functions can be rapidly and easily performed, and whose cells can be accessed in random order (independent of their physical locations), are referred to as random-access memories (RAMs). Read-only memories (ROMs) are those in which only the read operation can be performed rapidly. Entering data into a ROM is referred to as programming the ROM. This operation is much slower than the writing operation used in RAMs.

The storage cells in a typical semiconductor memory are arranged in an array consisting of horizontal rows and vertical columns. In an array a cell may be most accurately defined as the smallest functional unit which can be duplicated to form the whole array. Each cell shares electrical connections with all the other cells in its row, and column. The horizontal lines connected to all the cells in the row are called word lines, and the vertical lines (along which data flows into and out of the cells) are referred to as data lines. Each cell therefore has a unique memory location, or address, which can be accessed at random through the selection of the appropriate word and data line. Some memories are designed so that all the cells in a row are accessed simultaneously. This array configuration of semiconductor memories lends itself well to the regular structured designs which are favored in VLSI.

There are a number of important circuits on the periphery of the array. One such peripheral circuit is the address decoder. This circuit allows a large number of word and data lines to be accessed with the fewest number of address lines. Address decoders for this purpose have $2^n$ output lines, with a different one selected for each different n-bit input code. In later generations of memory circuits, address multiplexing was integrated on some memory chips to reduce the number of address pins by half.

Another peripheral circuit is the read/write control circuitry. This circuitry determines whether data is to be written into or read from the memory. Because such circuits also amplify and buffer the data signals retrieved from the cells, one of the important circuits in this subsystem is the sense amplifier. In dynamic memories that need periodic data refreshing, refresh circuitry may also be provided.

Recently, additional peripheral circuits have been added to the basic memory organization structure. These circuits serve mainly to improve the manufacturability and testability of the chips. Those designed to increase manufacturability include redundancy circuits and error-correction circuits. Redundancy circuits allow some defective chips to be salvaged, while self-testing circuits reduce testing time. Error-detection and correction techniques involve the addition of parity bits to allow the system to detect bad data, accomplish parity checking, and in some cases provide correction of the data errors.

Most RAMs have only one input-data lead and one output-data lead (or a single combined input/output lead). Writing into and reading from such RAMs is done one bit at a time. Other RAMs have a number of input- and output-data leads, with the number determined by the word length of the system's data bus. ROMs, on the other hand, are typically organized so that the number of output-data leads is the same as the number of lines on the data bus. ROMs are programmed word by word and are read from in the same manner.

In semiconductor RAMs, information is stored on each cell either through the charging of a capacitor or the setting of the state of a bi-stable flip-flop circuit. With either method, the information on the cell is destroyed if the power is interrupted. Such memories are therefore referred to as volatile memories. When the charge on a capacitor is used to store data in a semiconductor-RAM cell, the charge needs to be periodically refreshed, since leakage currents will remove it in a few milliseconds. Hence, volatile memories based on this storage mechanism are known as dynamic RAMs, or DRAMs.

If the data is stored (written) by setting the state of a flip-flop, it will be retained as long as power is connected to the cell (and flip-flop is not reset by another write signal). RAMs fabricated with such cells are known as static RAMs, or SRAMs. Volatile RAMs can be treated as non-volatile if they are provided with a battery backup. Some DRAM and SRAM chips are even packaged together with a battery to facilitate implementation of this approach.

It is often desirable to use memory devices that will retain information even when the power is interrupted. Magnetic media offer such nonvolatile-memory storage. In addition, a variety of semiconductor memories have been developed with this characteristic. At present, virtually all such nonvolatile memories are ROMs. While data can be entered into these memories, the programming procedure varies from one type of ROM to the other.

The first group of nonvolatile memories consists of those ROMs in which data is entered during manufacturing, and cannot be subsequently altered by the user. These devices are known as masked ROMs (or simply ROMs). The next category consists of memories whose data can be entered by the user (user-programmable ROMs). In the first example of this type, known as a programmable ROM, or PROM, data can be entered into the device only once. In the remaining ROM types, data can be erased as well as entered. In one class of erasable ROMs, the cells must be exposed to a strong ultraviolet light in order for the data to be erased. These ROMs are called erasable-programmable ROMs, or EPROMs. In the final type, data can be electrically erased as well as entered into the device, these are referred to as EEPROMs. The time needed to enter data into both EPROMs and EEPROMs is much longer than the time required for the write operation in a RAM. As a result, none of the ROM types can at present be classified as fully functional RAM devices.

Many variations on the basic memory organization architecture have been developed, including video RAMs and multiport RAMs. Architectures which combine memory and logic circuits on the same chip are becoming increasingly popular. However, the primary trends in semiconductor memory development are to increase the storage density and to reduce the cost per bit. It would therefore be desirable to have a method and structure for further increasing the bit storage density and reducing the cost per bit.

SUMMARY OF THE INVENTION

The problems outlined above are in large part solved by a memory circuit which uses multiple storage mechanisms in each of its memory cells. In one embodiment, the memory circuit includes an array of cells in which each cell has multiple storage elements. At least one of the storage elements performs its function in a different way than the rest of the storage elements. This use of multiple storage mechanisms allows for a greater freedom in memory cell design and allows for the simultaneous storage of multiple states in a single memory cell.

Broadly speaking, the present invention contemplates a memory core comprising an address decoder, an array of cells, and a sense amplifier. The address decoder is configured to receive an address and responsively assert a selected word line. The array of cells includes a selected cell coupled to the selected word line, and each cell in the array of cells includes at least two storage elements. A first storage element is configured with a first state which is one of a first plurality of states, and a second storage element is configured with a second state which is one of a second, different plurality of states. The sense amplifier is coupled to the selected cell via a bit line and configured to detect the first and second states. Each cell may further include a third storage element configured with a third state which is one of a third plurality of states. In this case, the sense amplifier is also configured to detect the third state. Examples of candidate storage states include charges on a capacitance, conductivities of transistors, resistances between terminals, turn-on voltages of transistors, currents flowing in closed loops, and orientations of magnetized material.

BRIEF DESCRIPTION OF THE DRAWINGS

Other objects and advantages of the invention will become apparent upon reading the following detailed description and upon reference to the accompanying drawings in which.

Figure 1:
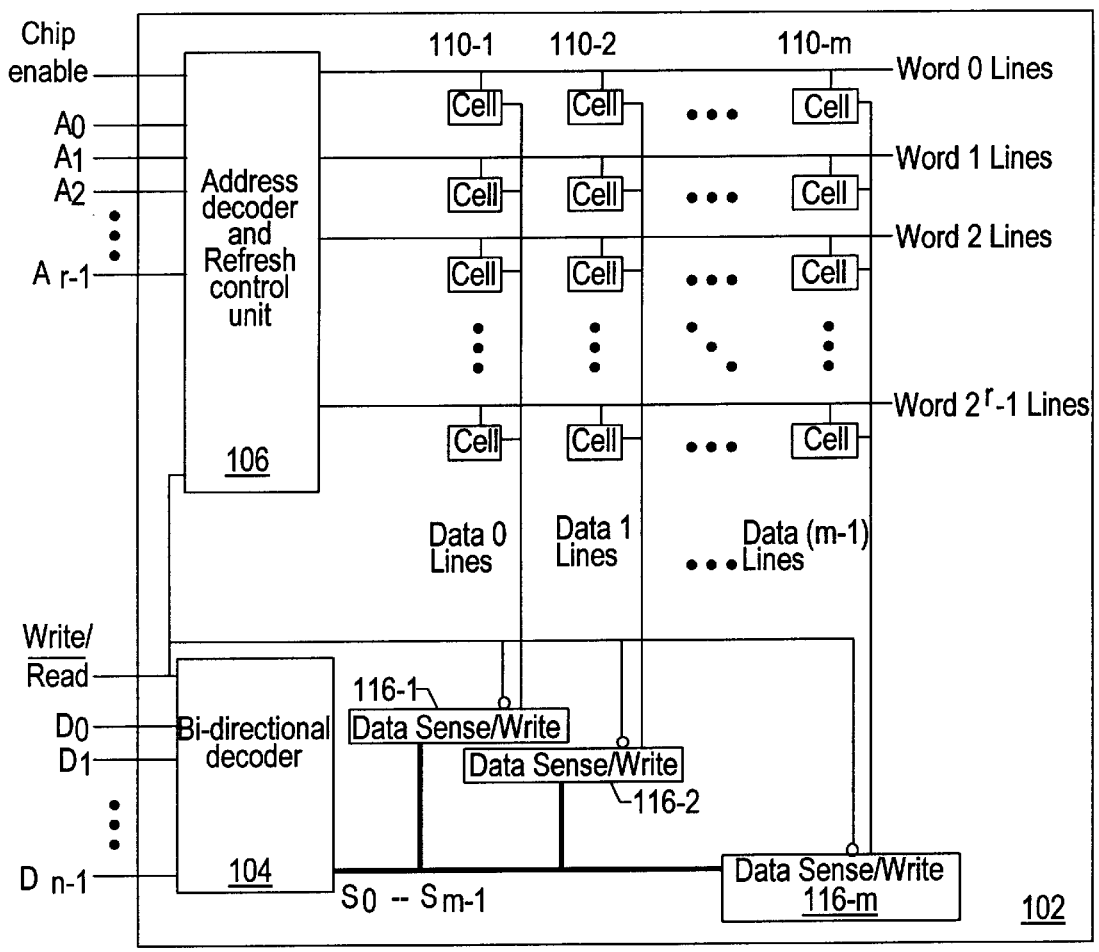
FIG. 1 is a block diagram of a semiconductor memory architecture using multiple storage mechanisms according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 shows an exemplary memory architecture using memory cells with multiple storage mechanisms. In this embodiment, memory 100 has a ground plane 102 surrounding the chip circuitry which shields the circuitry from electromagnetic noise. Memory 100 receives a chip enable signal, a read/write signal, and r address bit signals at an address decoder and refresh unit 106. During operation when the chip enable signal is asserted with the read/write signal indicating a read, address decoder and refresh unit 106 controls the word lines associated with one of $2^r$ rows of memory cells. When the word lines are controlled in a manner which is described further below, the corresponding row of memory cells may be read and refreshed. In a similar fashion, the corresponding row of memory cells may be written to.

Memory 100 also has n bi-directional binary data lines ($D_0$–$D_{n-1}$) connected to a bi-directional decoder 104. Bi-directional decoder 104 is coupled to receive the read/write signal and is further coupled to m data paths which carry multi-value logic signals ($S_0$–$S_{m-1}$). Each of the data paths can be driven by either bi-directional decoder 104 or one of a set of data sense/write modules 116-1 through 116-m (referred to collectively as modules or sense amplifier modules 116). Each of the modules 116 is coupled to a pair of data lines. Each pair of data lines is coupled to a column of the memory cells.

An exemplary memory read operation is now described. Consider a situation in which the address bits are all zero, the write/read control line indicates a read operation, and the chip enable signal is asserted. Upon occurrence of this situation, address decoder and refresh unit 106 manipulates the word lines for word 0 (i.e. "Word 0 Lines"). This allows modules 116 to sense charges stored in cells 110-1 through 110-m via the data lines. Subsequent to the sense operation, modules 116 convert the sensed charges into m multi-value logic signals ($S_0$–$S_{m-1}$) which are coupled to bi-directional decoder 104. Bi-directional decoder 104 converts the m multi-value logic signals ($S_0$–$S_{m-1}$) to n binary digital signals, and drives the n bits on data lines $D_0$–$D_{n-1}$. In this manner, a multi-value logic state stored in each cell may be read.

In one specific implementation, the cells being read are refreshed concurrent with the read operation. For the implementation of FIG. 1, modules 116 convert the m multi-value logic signals ($S_0$–$S_{m-1}$) into multi-level voltage signals and drive them on the data lines which are coupled to cells 110. If at this time the word 0 lines are manipulated as described further below, cells 110 store the multi-level voltage signals. In this way, the content of cells 110 can be refreshed every time they are read.

The effectuation of memory write operations is similar. For example, if the address bits are all zero and the write/read control line indicates a write operation when the chip enable signal is asserted, then address decoder and refresh unit 106 manipulates the word 0 lines. Bi-directional decoder 104 receives data from the bi-directional binary data lines $D_0$–$D_{n-1}$ and converts the data into m multi-value logic signals which are driven onto the m data paths. The modules 116 convert the input m multi-value logic signals into multi-level voltage signals and drive the data lines coupled to the selected cells 110. Having the word 0 lines manipulated as described further below causes the multi-level signals to be stored in cells 110.

Address decoder and refresh unit 106 may further include refresh circuitry to read and refresh the contents of each memory cell within a given time interval. The refresh cycles can be implemented in many ways, one of which is to have them happening continuously while the chip is not enabled. In this implementation method, bi-directional decoder 104 is disabled and the modules 116 are enabled during refresh cycles. Address decoder and refresh unit 106 may employ a counter which sequentially manipulates each group of word lines, causing a read and refresh operation similar to that described previously. In order to assure that each memory cell is refreshed, the chip must spend a specified fraction of a given time interval in the disabled mode.

Figure 2:
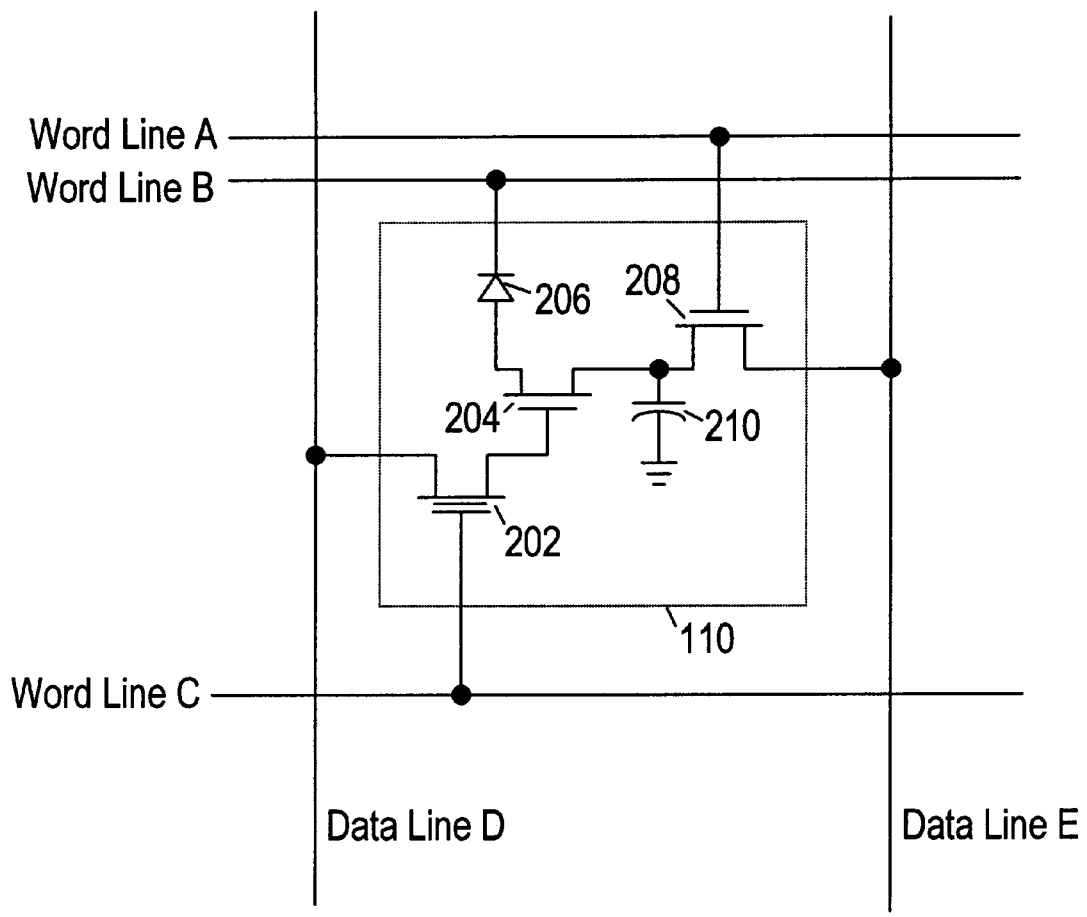
FIG. 2 is a block diagram illustrating the function of a memory cell according to present invention.

Turning now to FIG. 2, portions of memory circuit 100 are shown in greater detail. Circuit portions that correspond to those of FIG. 1 are numbered identically for simplicity and clarity. FIG. 2 illustrates a memory cell 110 which is exemplary of each of the cells of FIG. 1. Memory cell 110 includes a floating gate transistor 202, a storage transistor 204, a read transistor 208, and a capacitance 210. The preferred embodiment also includes a diode 206. Memory cell 110 is coupled to word lines A, B, and C, and to data lines D and E. When word lines A and C are low and word line B is high (or high impedance), memory cell 110 is in the storage mode. A first charge may be stored on the floating gate of transistor 202, a second charge may be stored on the gate of transistor 204, and a third charge may be stored on capacitance 210.

The process of sensing the three stored charges begins by driving word line A high, thereby causing transistor 208 to conduct, and consequently allowing the third charge on capacitance 210 to be sensed by module 116 via data line E. After the third charge has been sensed, word line B is driven low, thereby allowing diode 206 (if present) to conduct, and consequently allowing the conductivity of transistor 204 to be sensed by module 116 via data line E. Since the conductivity of transistor 204 is determined by the stored second charge, module 116 is able to determine the second charge.

Subsequent to the determination of the second charge, word line C is driven high while data line D is driven low, thereby causing transistor 202 to conduct, and consequently discharging the gate of transistor 204. The conductivity of transistor 202 is dependent on the stored first charge on the floating gate. To determine this first charge, data line D is driven high and allowed to charge the gate of transistor 204 for a fixed time interval. The end of this interval may be marked by driving word line C low, thereby causing transistor 202 to stop conducting. This results in a fourth charge being stored on the gate of transistor 204. The fourth charge is directly related to the size of the first charge, and may be sensed in the same fashion as the second charge, i.e. by measuring the conductivity of transistor 204 via data line E. In this fashion, module 116 is able to sense the first, second and third charges stored in memory cell 110.

Module 116 determines a digital representation of the sensed first, second and third charges, and for a read operation, module 116 drives a multilevel digital signal representation of the sensed values to bi-directional decoder 104. After each read operation, and during refresh operations, the second and third charges must be re-stored in memory cell 110. To achieve this, word lines A and C are driven high while word line B is driven low, and module 116 drives a voltage on data line D while measuring the conductivity of transistor 204 via data line E. The voltage level on data line D is adjusted until the desired second charge quantity is stored on the gate of transistor 204 (as determined by the measured conductivity). Word line C is then driven low and word line B is driven high. Module 116 then charges capacitance 210 to the potential necessary to store the desired third charge on capacitance 210, after which word line A is driven low. Thus memory cell 110 has been returned to the storage mode with the second and third charges refreshed.

The process of writing the three stored charges begins with the storage of the first charge. Word line C is driven to a high voltage and data line D is driven low to create a high electric field across a tunneling oxide in transistor 202. This causes the floating gate to become negatively charged. Once an equilibrium has been reached, word line C is driven low and data line D is driven to a high voltage to reverse the electric field across the tunneling oxide for a predetermined amount of time. This allows the charge on the floating gate to be discharged the amount necessary to leave the desired charge quantity on the floating gate. The storage of the second and third charges may then occur as described above. Specifically, word lines A and C are driven high while word line B is driven low, and module 116 drives a voltage on data line D while measuring the conductivity of transistor 204 via data line E. The voltage level on data line D is adjusted until the desired second charge quantity is stored on the gate of transistor 204 (as determined by the measured conductivity). Word line C is then driven low and word line B is driven high. Module 116 then charges capacitance 210 to the potential necessary to store the desired third charge on capacitance 210, after which word line A is driven low. Thus memory cell 110 has been placed in storage mode with the desired first, second and third charges.

Figure 3:
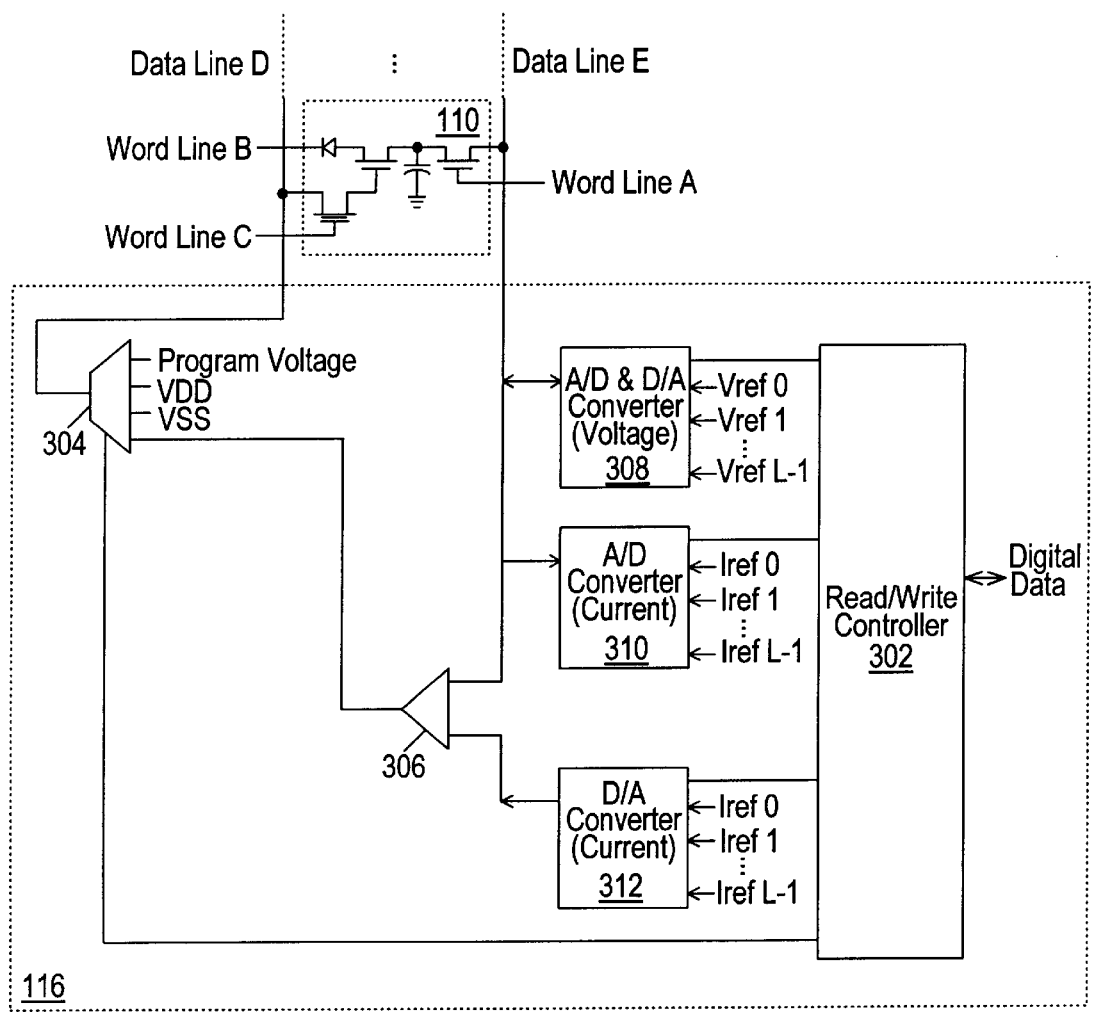
FIG. 3 is a block diagram illustrating an embodiment of the data sense/write module.

Turning now to FIG. 3, one embodiment of module 116 is illustrated. Module 116 includes a read/write controller 302, a data line multiplexer 304, a feedback circuit 306, a bi-directional analog to digital (A/D) and digital to analog (D/A) converter 308, and an A/D converter 310, and a D/A converter 312. During a read cycle, word line A is driven high to allow bi-directional converter 308 to sense the charge on capacitor 210. Bi-directional converter 308 receives reference voltages $Vref_0 - Vref_{L-1}$ to determine a digital representation of the logic state represented by the charge on capacitance 210. In this embodiment, L possible logic states are allowed. The digital representation is sent to Read/Write controller 302. Word line B is then driven low to allow the A/D converter 310 to sense the current through transistor 204. A/D converter 310 receives reference currents $Iref_0 - Iref_{L-1}$ to determine a digital representation of the logic state represented by the charge on the gate of transistor 204. In this embodiment, L possible logic states are allowed, although a different number may also be realized. The digital representation is sent to Read/Write controller 302. Read/Write controller 302 then drives data line D low by switching multiplexer 304 to $V_{SS}$ while word line C driven high. This is followed by Read/Write controller 302 driving data line D high with multiplexer 304 switched to $V_{DD}$ for a fixed amount of time before word line C is driven low. This causes the charge on the gate of transistor 204 to be discharged and replaced by a charge determined by the charge on the floating gate of transistor 202. A/D converter 310 then re-determines the digital representation of the charge on the gate of transistor 204 and sends the determination to Read/Write controller 302. Each of the digital representations are latched and an overall logical state for memory cell 110 is determined and output to bi-directional decoder 104.

During a write cycle, Read/Write controller 302 receives an overall logical state for memory cell 110. This overall logical state is decomposed into desired first, second, and third charges for the floating gate of transistor 202, the gate of transistor 204, and capacitance 210. When word line C is driven to a high programming voltage, Read/Write controller 302 uses multiplexer 304 to drive data line D low ($V_{SS}$) to allow a negative charge to accumulate on the floating gate. Word line C is then driven low while Read/Write controller 302 switches multiplexer 304 to the program voltage for an amount of time necessary to cause the charge on the floating gate to equal the desired first charge. Word lines A and C are then driven high with word line B driven low. Read/Write controller 302 switches multiplexer 304 to the output signal from feedback circuit 306. The D/A converter 312 sets a desired current, and feedback circuit 306 begins charging the gate of transistor 204 until the desired second charge is reached. Word line C is driven low and word line B is driven high. Bi-directional converter 308 then charges capacitance 210 to the desired third charge, and word line A is driven low.

The feasibility of combining multiple storage techniques in a single memory cell has been demonstrated by the described embodiment. A memory cell may be defined as the smallest functional unit from which a memory array can be constructed. A memory array is collection of two or more memory cells which are accessed by a single address decoder. Examples of memory storage techniques include:

(1) setting the potential-altering ability of a capacitor, e.g. by storing a charge on it as is done in 1T DRAMs, (2) setting the conductivity of a transistor, e.g. by storing a charge on the gate as is done in 3T DRAMs, (3) setting the turn-on voltage of a transistor, e.g. by storing a charge on a floating gate as is done in EEPROMs, (4) setting the resistivity between a word line and a data line, e.g. by placing or omitting a connecting device between them as is done in ROMs, (5) setting a direction of current flow in superconducting loops, e.g. by saturating one of two Josephson Junctions in the loop as proposed in U.S. Pat. No. 5,247,475, (6) setting a magnetic field orientation of a ferromagnetic material, e.g. by exposing it to current-induced magnetic fields as proposed in U.S. Pat. No. 4,791,604.

It is noted that each of the above techniques may be implemented in a wide variety of ways. For example, the capacitor used in a 1T DRAM cell may be a trench capacitor or a capacitor formed from stacked layers of polysilicon with a dielectric between. The charge may be stored using a current source or a voltage source. Similarly, the resistivity between a word line and a data line can be set using transistors, diodes, fuses, or resistive vias of varying sizes.

Numerous variations and modifications will become apparent to those skilled in the art once the above disclosure is fully appreciated. For example, the channel conductivities which represent the multi-level logic states may be chosen to maximize the detection margin, or be adjustable to permit a range of refresh time to be used. It is intended that the following claims be interpreted to embrace all such variations and modifications.

What is claimed is:

1. A memory comprising:
   a cell array having a plurality of cells, wherein each cell includes:
   a first storage element of a first type including a floating gate transistor, wherein the first storage element is configured to store a first state within a floating gate of said floating gate transistor, and
   a second storage element of a second type which is different from the first type wherein said second storage element includes a capacitance upon which a second state is stored, wherein the second storage element is configured to store a second state, said second state being different from and independent of said first state;
   an address decoder configured to receive an address and coupled to the cell array to responsively select a selected cell from the plurality of cells; and
   a sense amplifier coupled to the selected cell to detect the first state and the second state.

2. The memory of claim 1, wherein each cell further comprises a third storage element of a third type which is different from the first and the second types, wherein the third storage element is configured to store a third state, wherein said third state is different from and independent of said first and second states, and wherein the sense amplifier is also coupled to the selected cell to detect the third state.

3. The memory of claim 1, wherein the address decoder is configured to select the selected cell by asserting a first word line coupled to the selected cell, and wherein the sense amplifier is configured to detect the first state via a bit line coupled to the selected cell.

4. The memory of claim 3, wherein the sense amplifier is further configured to detect the second state via the bit line.

5. The memory of claim 4, wherein the address decoder is configured to control a second word line coupled to the selected cell, wherein the sense amplifier is configured to detect the first state when the first word line is asserted and the second word line is asserted, and wherein the sense amplifier is configured to detect the second state when the first word line is asserted and the second word line is de-asserted.

6. The memory of claim 2, wherein the third type of storage element is a transistor and the third state is represented by a turn-on voltage of the transistor.

7. A memory core comprising:
an address decoder configured to receive an address and responsively assert a selected word line;
an array of cells which includes a selected cell coupled to the selected word line, wherein each cell in the array of cells includes:
a first storage element including a floating gate transistor configured with a first state which is one of a first plurality of states, and
a second storage element including a capacitance configured with a second state which is one of a second plurality of states, said second plurality of states being different from and independent of said first plurality of states; and
a sense amplifier coupled to the selected cell via a bit line and configured to detect the first and the second states.

8. The memory core of claim 7, wherein each cell in the array of cells further includes a third storage element configured with a third state which is one of a third plurality of states, wherein the third plurality of states is different from and independent of the first and second pluralities of states, and wherein the sense amplifier is also configured to detect the third state.

9. The memory core of claim 8, wherein the third storage element is a transistor, and the third state is a turn-on voltage.

10. A memory core comprising:
an address decoder configured to receive an address and responsively assert a selected word line to select a selected cell;
an array of cells which includes said selected cell coupled to the selected word line, wherein each cell in the array of cells includes:
a first storage element configured to store a first state, wherein said first storage element is a capacitance and said first state is represented by a charge on the capacitance,
a second storage element configured to store a second state, wherein said second state is different from and independent of said first state, wherein said second storage element is a first transistor and said second state is represented by a channel conductivity of said first transistor, and
a third storage element configured to store a third state, wherein said third state is different from and independent of said first and said second states, wherein said third storage element is a second transistor and said third state is represented by a turn-on voltage of said second transistor; and
a sense amplifier coupled to the selected cell via a bit line and configured to detect via said bit line said first, second and third states.

* * * * *